United States Patent
Loubet et al.

(10) Patent No.: US 9,123,809 B2
(45) Date of Patent: Sep. 1, 2015

(54) TRANSISTOR HAVING A STRESSED BODY

(71) Applicant: STMicroelectronics, Inc., Coppell, TX (US)

(72) Inventors: Nicolas Loubet, Guilderland, NY (US); Prasanna Khare, Schenectady, NY (US); Qing Liu, Watervliet, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/494,979

(22) Filed: Sep. 24, 2014

(65) Prior Publication Data

US 2015/0008521 A1    Jan. 8, 2015

Related U.S. Application Data

(63) Continuation of application No. 13/454,570, filed on Apr. 24, 2012, now abandoned.

(51) Int. Cl.

| | |
|---|---|
| *H01L 29/76* | (2006.01) |
| *H01L 29/78* | (2006.01) |
| *H01L 21/265* | (2006.01) |
| *H01L 29/66* | (2006.01) |
| *H01L 21/8238* | (2006.01) |
| *H01L 21/84* | (2006.01) |
| *H01L 27/12* | (2006.01) |
| *H01L 21/266* | (2006.01) |
| *H01L 21/762* | (2006.01) |
| *H01L 29/06* | (2006.01) |

(52) U.S. Cl.

CPC .......... *H01L 29/7848* (2013.01); *H01L 21/266* (2013.01); *H01L 21/26506* (2013.01); *H01L 21/76224* (2013.01); *H01L 21/823807* (2013.01); *H01L 21/823814* (2013.01); *H01L 21/823878* (2013.01); *H01L 21/84* (2013.01); *H01L 27/1203* (2013.01); *H01L 29/0649* (2013.01); *H01L 29/66628* (2013.01); *H01L 29/7849* (2013.01)

(58) Field of Classification Search

USPC .......... 257/213, 288, 368, E29.242; 438/360, 438/365

See application file for complete search history.

(56) References Cited

U.S. PATENT DOCUMENTS

| | | |
|---|---|---|
| 2005/0280098 A1 | 12/2005 | Shin et al. |
| 2007/0290264 A1* | 12/2007 | Sugii et al. ................ 257/348 |
| 2008/0265281 A1 | 10/2008 | Chen et al. |
| 2008/0303090 A1* | 12/2008 | Ieong et al. .............. 257/351 |
| 2009/0090950 A1 | 4/2009 | Forbes et al. |
| 2009/0224321 A1* | 9/2009 | Tsuchiya .................. 257/351 |
| 2009/0283828 A1 | 11/2009 | Clark, Jr. et al. |
| 2011/0074498 A1 | 3/2011 | Thompson et al. |
| 2012/0286329 A1 | 11/2012 | Cheng et al. |
| 2012/0313168 A1 | 12/2012 | Cheng et al. |

* cited by examiner

*Primary Examiner* — Julia Slutsker

(74) *Attorney, Agent, or Firm* — Gardere Wynne Sewell LLP

(57) ABSTRACT

A transistor includes a body and a semiconductor region configured to stress a portion of the body. For example, stressing a channel of the transistor may increase the mobility of carriers in the channel, and thus may reduce the "on" resistance of the transistor. For example, the substrate, source/drain regions, or both the substrate and source/drain regions of a PFET may be doped to compressively stress the channel so as to increase the mobility of holes in the channel. Or, the substrate, source/drain regions, or both the substrate and source/drain regions of an NFET may be doped to tensile stress the channel so as to increase the mobility of electrons in the channel.

21 Claims, 4 Drawing Sheets

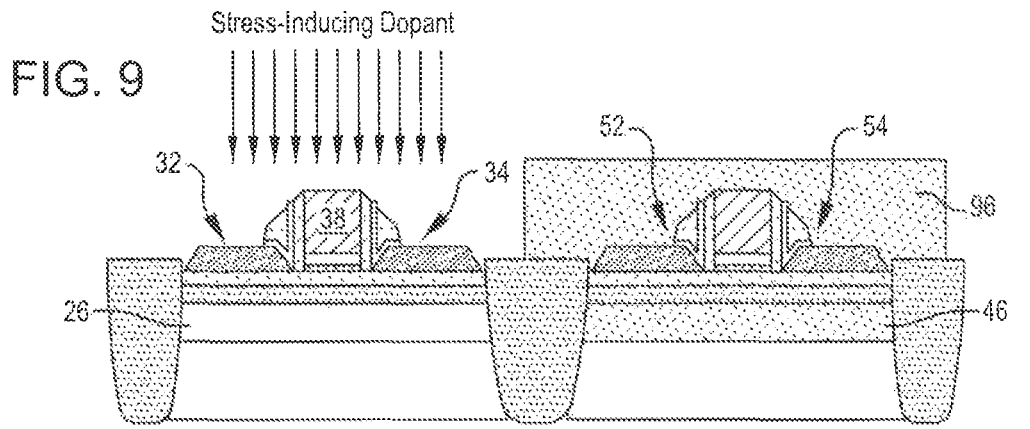
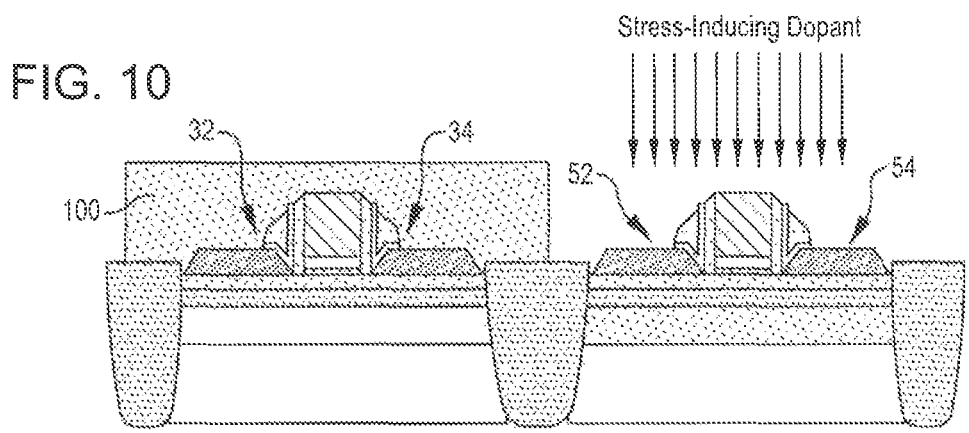
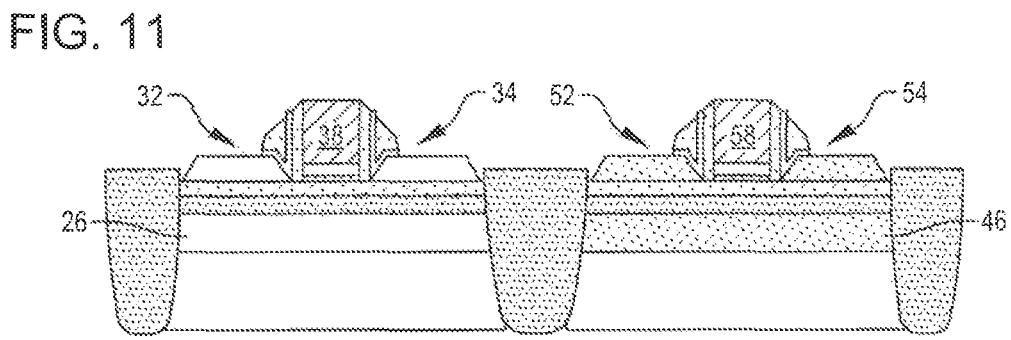
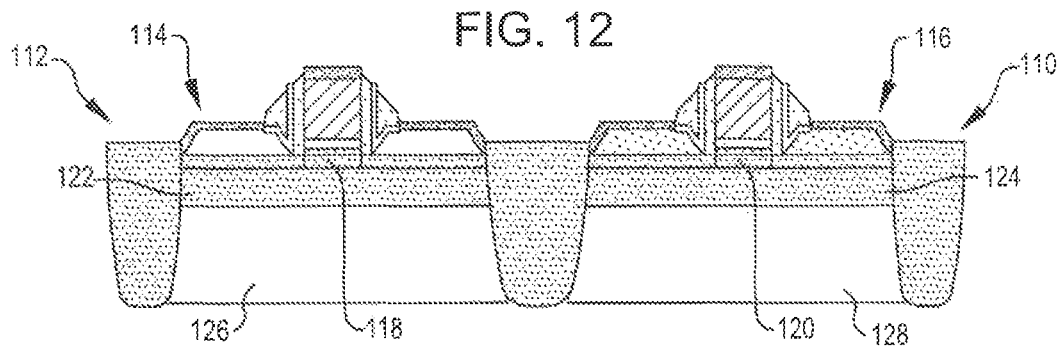

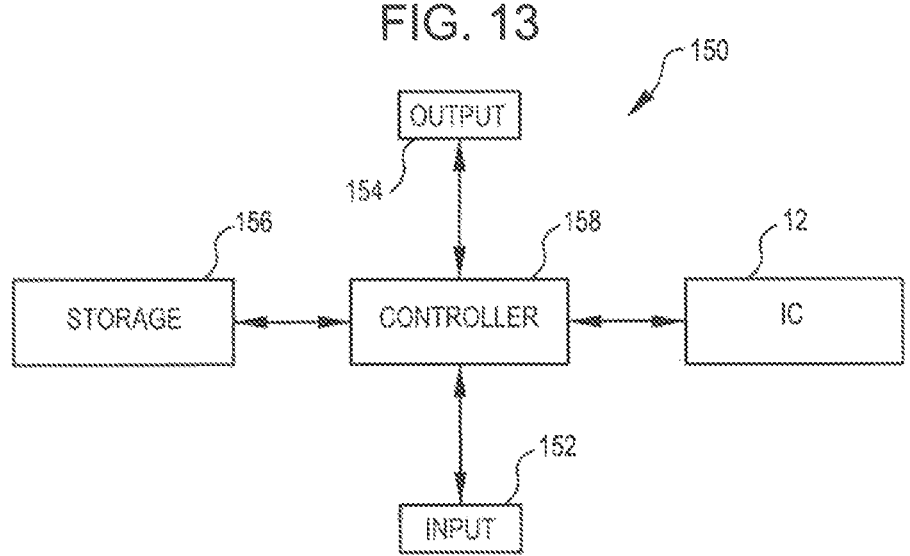

TRANSISTOR HAVING A STRESSED BODY

CROSS-REFERENCE TO RELATED APPLICATION

This application is a continuation of U.S. application patent Ser. No. 13/454,570 filed Apr. 24, 2012, the disclosure of which is incorporated by reference.

SUMMARY

An embodiment of a transistor includes a body and a semiconductor region configured to stress a portion (e.g., the channel) of the body.

In an embodiment, the semiconductor region may be configured to stress a channel of the transistor to increase the mobility of carriers in the channel, and thus to reduce the "on" resistance of the transistor. Reducing a transistor's "on" resistance may increase the speed at which a circuit may switch the transistor, and thus may make the transistor suitable for high-speed applications such as high-speed logic circuits. Furthermore, reducing a transistor's "on" resistance may decrease the power that the transistor consumes while conducting a current, and thus may make the transistor suitable for current-conducting applications such as a switching transistor in a switching power supply.

In a further embodiment, the substrate, source/drain regions, or both the substrate and source/drain regions of a silicon-on-insulator (SOI) P-type field-effect transistor (PFET) may be doped with a stress-inducing dopant such as germanium (Ge) so that the region(s) exert(s) a compressive stress on the channel to increase the mobility of holes in the channel. Or, the substrate, source/drain regions, or both the substrate and source/drain regions of a SOI N-type field-effect transistor (NFET) may be doped with a stress-inducing dopant such as carbon (C) so that the region(s) exert(s) a tensile stress on the channel to increase the mobility of electrons in the channel.

Furthermore, the stress-generating semiconductor region may be implanted with a stress-inducing dopant using the same mask that is used for other implants into the semiconductor region so that no additional lithography steps are needed to form a stressed transistor body.

Similarly, the stress-generating semiconductor region may be annealed in the same step during which other dopants into the region are annealed.

Alternatively, the stress-generating semiconductor region may be formed (e.g., grown or deposited) to include a stress-inducing dopant so that no additional implant of a stress-inducting dopant into the semiconductor region is needed. For example, such a semiconductor region may be grown or deposited as silicon germanium (SiGe) or silicon carbide (SiC).

BRIEF DESCRIPTION OF THE DRAWINGS

Unless otherwise noted, like numbers reference like components throughout the following drawings.

FIGS. 2-11 are cross-sectional views of the integrated-circuit portion of FIG. 1 during respective fabrication steps of the NFET and PFET according to an embodiment.

FIG. 12 is a cross-sectional view of an integrated-circuit portion that includes an NFET and a PFET with stressed bodies according to another embodiment.

FIG. 13 is a diagram of a system that incorporates at least one of the integrated circuits of FIGS. 1 and 12 according to an embodiment.

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

Figure 1:
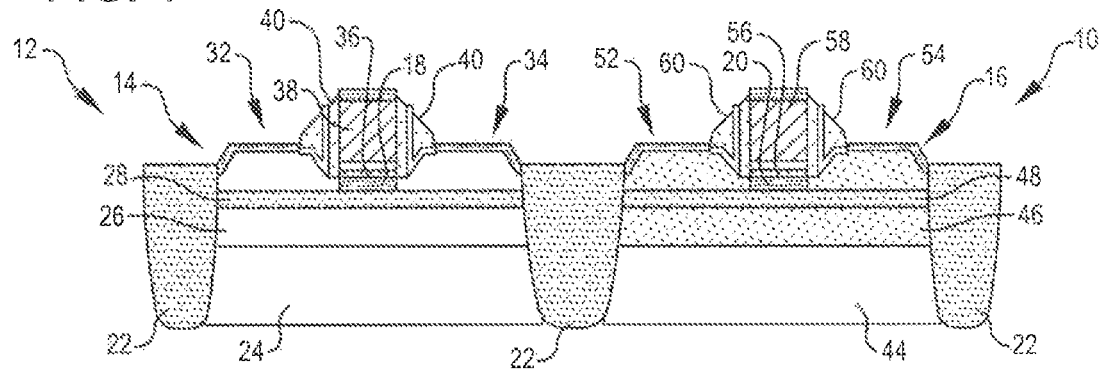
FIG. 1 is a cross-sectional view of an integrated-circuit portion that includes an N-type field-effect transistor (NFET) and a P-type field-effect transistor (PFET) with stressed bodies according to an embodiment.

FIG. 1 is a cross-sectional view of a portion 10 of an embodiment of an integrated circuit 12, the portion including an NFET 14 and a PFET 16 with stressed bodies 18 and 20, respectively; in an embodiment, the NFET and PFET are ultra-thin-body-on-buried-oxide (UTBB) transistors. Because the bodies 18 and 20 are stressed, the carrier mobilities in the channels formed in these bodies may be increased. And the increased carrier mobilities may decrease the "on" resistances of the NFET 14 and PFET 16 so that these transistors may have higher switching speeds and lower power losses than comparable transistors with unstressed bodies. Therefore, the NFET 14 and PFET 16 may be suitable for high-speed applications such as high-speed logic, or for applications, such as in switching power supplies, where a transistor may conduct a substantial current while "on." Furthermore, as discussed below, the NFET 14 and PFET 16 may be fabricated without increasing the number of masks as compared to comparable transistors with unstressed bodies. Moreover, as discussed below, the NFET 14 and PFET 16 may be fabricated without increasing the number of fabrication steps as compared to comparable transistors with unstressed bodies.

Still referring to FIG. 1, the integrated circuit 12 may be any type of integrated circuit including a memory, analog circuit, or controller such as a microcontroller or microprocessor. Furthermore, the integrated circuit 12 may include more than one NFET 14 or more than one PFET 16, an NFET 14 but not a PFET 16 or vice-versa, other types of transistors such as bipolar transistors and other types of FETs, and types of components and devices other than transistors.

The integrated-circuit portion 10 includes trench-isolation regions 22, which electrically isolate the NFET 14 and the PFET 16 from each other and from other surrounding transistors or devices (omitted from FIG. 1).

The NFET 14 includes a substrate 24, a stress-inducing region 26 disposed in the substrate, a buried oxide 28 disposed over the stress-inducting region, the P-type body 18 disposed over the buried oxide, N-type source/drain regions 32 and 34 disposed over the buried oxide and adjacent to the body, a gate insulator 36 disposed over the body, a gate 38 disposed over the gate insulator, and sidewall spacers 40, which electrically isolate the gate from the source-drain regions.

The substrate 24 may include a conventional conductivity dopant to make the substrate N-type or P-type as desired, and may include a ground-plane dopant to improve the short-channel effect, and to adjust the threshold, of the NFET 14. The ground-plane dopant may improve the short-channel effect by directing electric fields from the source/drain regions 32 and 34 toward the substrate 24, instead of across the channel toward each other, to uncouple electrically the source/drain regions from one another. For example, to improve the short-channel effect, and to increase the threshold voltage, of the NFET 14, one may implant into the substrate 24 an acceptor-type dopant such as Indium (In). Conversely, to improve the short-channel effect, and to decrease the threshold voltage, of the NFET 14, one may implant into the substrate 24 a donor-type dopant such as arsenic (As).

The stress-inducing region 26 increases the tensile stress in the substrate 24, and thus increases the tensile stress, and hence the carrier mobility (here the electron mobility), in the channel formed in the body 18 when a suitable channel-forming voltage is applied to the gate 38; that is, at least a portion of the increased tensile stress in the substrate is transferred to the channel through the buried oxide layer 28. In an embodiment, a stress-inducing dopant, such as carbon (C), is disposed within the stress-inducing region 26 to increase the tensile stress in the substrate 24, where the level of tensile stress is proportional to the concentration of the stress-inducing dopant in the stress-inducing region. For example, a concentration of C atoms in the range of approximately 0-3% of the total number of atoms in the stress-inducing region 26 may cause the substrate 24 to impart a suitable tensile stress to the channel. And as discussed below in conjunction with FIG. 3, if one implants the stress-inducing dopant into the substrate 24 to form the stress-inducing region 26, he/she may do so using the same mask that is used for implanting the ground-plane dopant such that no additional lithographic step is needed as compared to the fabrication of an NFET transistor with no stress-inducing dopant implanted into its substrate.

The buried oxide 28 may be formed in a conventional manner to have any suitable thickness, for example, in approximately the range of 10-25 nanometers (nm).

The N-type source/drain regions 32 and 34 may also increase the tensile stress on, and thus the carrier mobility (here the electron mobility) in, of the channel formed in the body 18.

The source/drain regions 32 and 34 may include a conventional donor dopant, such as As, that gives the source/drain regions their N-type conductivities.

Furthermore, the source/drain regions 32 and 34 may include a stress-inducing dopant that increases the tensile stress of the source/drain regions, which transfer at least a portion of this increased tensile stress to the body 18 so as to increase the carrier mobility (here the electron mobility) of the channel; as discussed above, the level of tensile stress in the source/drain regions 32 and 34 is proportional to the concentration of the stress-inducting dopant in the source/drain regions. In an embodiment, a stress-inducting dopant, such as carbon (C), is disposed in the source/drain regions 32 and 34. For example, a concentration of C atoms in a range of approximately 0-3% of the total number of atoms in each source/drain region 32 and 34 may cause the source/drain regions to impart a suitable tensile stress to the channel. The tensile stress that the source/drain regions 32 and 34 impart to the channel is in addition to the tensile stress imparted by the stress-inducing region 26 of the substrate 24. Moreover, the stress-inducing-dopant concentration in the source/drain regions 32 and 34 may be less than the stress-inducing-dopant concentration in the stress-inducing region 26 for at least two reasons: 1) because the source/drain regions are closer to the body 18 than is the stress-inducing region (which is separated from the body by the buried oxide 28), a smaller stress-inducing-dopant concentration in the source/drain regions is needed to impart a given level of tensile stress to the channel as compared to the stress-inducing-dopant concentration in the stress-inducing region; and 2) to limit the diffusing of the stress-inducing dopant from the source/drain regions into the body region because stress-inducing dopant in the body region may degrade the performance of the NFET 14. As discussed below in conjunction with FIG. 9, if one implants the stress-inducing dopant into the source/drain regions 32 and 34, then he/she may do so using the same mask that is used for implanting the conductivity dopant such that no additional lithographic step is needed as compared to an NFET transistor with no stress-inducing dopant implanted into its source/drain regions.

The PFET 16 includes a substrate 44, a stress-inducing region 46 disposed in the substrate, a buried oxide 48 disposed over the stress-inducting layer, the N-type body 20 disposed over the buried oxide, P-type source/drain regions 52 and 54 disposed over the buried oxide and adjacent to the body, a gate insulator 56 disposed over the body, a gate 58 disposed over the gate insulator, and sidewall spacers 60, which electrically isolate the gate from the source-drain regions.

The substrate 44 may include a conventional ground-plane dopant to improve the short-channel effect, and to adjust the threshold, of the PFET 16. The ground-plane dopant may improve the short-channel effect by directing electric fields from the source/drain regions 52 and 54 toward the substrate 44, instead of across the channel toward each other, to uncouple electrically the source/drain regions from one another. For example, to improve the short-channel effect, and to increase the threshold voltage, of the PFET 16, one may dispose in the substrate 44 a donor-type dopant such as As. Conversely, to improve the short-channel effect, and to decrease the threshold voltage, of the PFET 16, one may dispose in the substrate 44 an acceptor-type dopant such as In.

The stress-inducing region 46 increases the compressive stress in the substrate 44, and thus increases the compressive stress, and hence the carrier mobility (here the hole mobility), in the channel formed in the body 20 when a suitable channel-forming voltage is applied to the gate 58; that is, at least a portion of the increased compressive stress in the substrate is transferred to the channel through the buried oxide layer 48. In an embodiment, a stress-inducing dopant, such as germanium (Ge), is disposed in the stress-inducing region 46 to increase the compressive stress in the substrate 44, where the level of compressive stress is proportional to the concentration of the stress-inducing dopant in the stress-inducing layer. For example, a concentration of Ge atoms in an approximate range of 0-30% of the total number of atoms in the stress-inducing region 46 may cause the substrate 44 to impart a suitable compressive stress to the channel—the magnitude of compressive stress generated by a given concentration of Ge is approximately one tenth of the magnitude of the tensile stress generated by the same concentration of C. And as discussed below in conjunction with FIG. 4, if one implants the stress-inducing dopant into the substrate 44 to form the stress-inducing region 46, then he/she may do so using the same mask that is used for implanting the ground-plane dopant such that no additional lithographic step is needed as compared to the fabrication of a PFET transistor with no stress-inducing dopant in its substrate.

The buried oxide 48 may be conventionally formed to have any suitable thickness, for example, in the approximate range of 10-25 nm.

The P-type source/drain regions 52 and 54 may also increase the compressive stress, and thus the carrier mobility (here the hole mobility), of the channel formed in the body 20.

The source/drain regions 52 and 54 may conventionally include an acceptor dopant, such as Phosphorous (P), that gives the source/drain regions their P-type conductivities.

Furthermore, the source/drain regions 52 and 54 may include a stress-inducing dopant that increases the compressive stress of the source/drain regions, which transfer at least a portion of this increased compressive stress to the body 20 so as to increase the carrier mobility (here the hole mobility) of the channel; as discussed above, the level of compressive stress in the source/drain regions 52 and 54 is proportional to the concentration of the stress-inducting dopant in the source/drain regions. In an embodiment, a stress-inducting dopant, such as Ge, is disposed in the source/drain regions 52 and 54. For example, a concentration of Ge atoms in an approximate range of 0-30% of the total number of atoms in each source/drain region 52 and 54 may cause the source/drain regions to impart a suitable compressive stress to the channel. The compressive stress that the source/drain regions 52 and 54 impart to the channel is in addition to the compressive stress that the stress-inducing region 26 of the substrate 44 imparts to the channel. Moreover, the stress-inducing-dopant concentration in the source/drain regions 52 and 54 may be less than the stress-inducing-dopant concentration in the stress-inducing region 46 for at least two reasons: 1) because the source/drain regions are closer to the body 20 than is the stress-inducing region (which is separated from the body by the buried oxide 48), a smaller stress-inducing-dopant concentration in the source/drain regions is needed to impart a given level of compressive stress to the channel as compared to the stress-inducing-dopant concentration in the stress-inducing region; and 2) to limit the diffusing of the stress-inducing dopant from the source/drain regions into the body region because stress-inducing dopant in the body may degrade the performance of the PFET 16. As discussed below in conjunction with FIG. 10, if one implants the stress-inducing dopant into the source/drain regions 52 and 54, then he/she may do this using the same mask that is used for implanting the conductivity dopant such that no additional lithographic step is needed as compared to a PFET transistor with no stress-inducing dopant implanted into its source/drain regions.

Although omitted from FIG. 1 for brevity, other conventional features, such as source/drain and gate silicides and contacts, as well as one or more metal, insulator, or passivation layers, may be disposed above or below the NFET 14 and PFET 16.

Still referring to FIG. 1, alternate embodiments are contemplated. For example, in the NFET 14, a stress-inducing dopant may be omitted from any one or two of the stress-inducing layer 26, source/drain region 32, and source/drain region 34; similarly, in the PFET 16, a stress-inducing dopant may be omitted from any one or two of the stress-inducing layer 46, source/drain region 52, and source/drain region 54. Furthermore, in the NFET 14, the type or concentration of the stress-inducing dopant may be different in any of the stress-inducing layer 26, source/drain region 32, and source/drain region 34; similarly, in the PFET 16, the type or concentration of the stress-inducing dopant may be different in any of the stress-inducing layer 46, source/drain region 52, and source/drain region 54. Moreover, the magnitude of tensile stress induced in the body 18 and channel of the NFET 14 may be different than the magnitude of the compressive stress induced in the body 20 and channel of the PFET 16. In addition, any of the dopants discussed may be included with the respective region (e.g., substrate, source/drain region) when the region is formed instead of being implanted into the region after the region is formed. For example, the chemistry of the reaction chamber may be adjusted so that as a source/drain region is being grown or deposited, it includes the dopant. For example, the stress-inducing region 26 or one or both of the source/drain regions 32 and 34 of the NFET 14 may be grown or deposited as SiC; similarly, the stress-inducing region 46 or one or both of the source/drain regions 52 and 54 of the PFET 16 may be grown or deposited as SiGe. Furthermore, regions other than the source/drain regions and substrate may include stress-inducing dopants to impart a stress to a transistor body region, to any other transistor region, or to any region of any device other than a transistor. Moreover, although ranges of stress-inducing-dopant concentrations are described, any concentration, or combination of concentrations, deemed suitable may be used. In addition, if the integrated circuit 12 includes multiple NFETS 14, then these NFETS need not generate the same level of tensile stress on their respective bodies and channels; similarly, if the integrated circuit includes multiple PFETS 16, then these PFETS need not generate the same level of compressive stress on their respective bodies and channels.

FIGS. 2-11 are cross-sectional views of the integrated-circuit portion 10 of FIG. 1 during respective fabrication steps of the NFET 14 and PFET 16 according to an embodiment. Some fabrication steps may be omitted from FIGS. 2-11 for brevity, and the disclosed steps may be performed in an order different than that described below.

Figure 2:
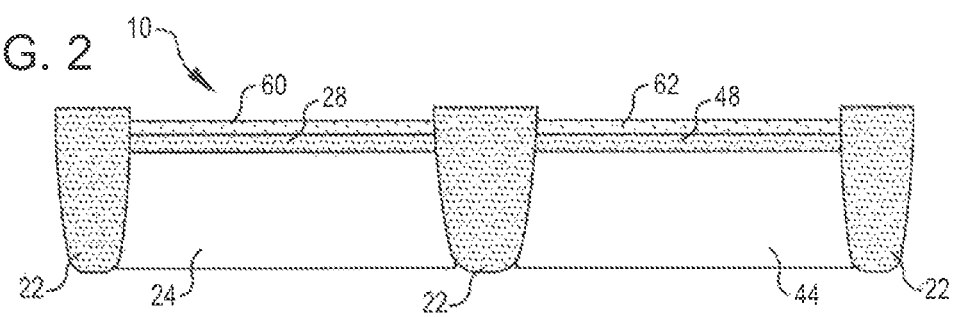

Referring to FIG. 2, regions 60 and 62 of a semiconductor material such as silicon are formed in a conventional manner over the buried oxide layers 28 and 48, respectively.

Figure 3:
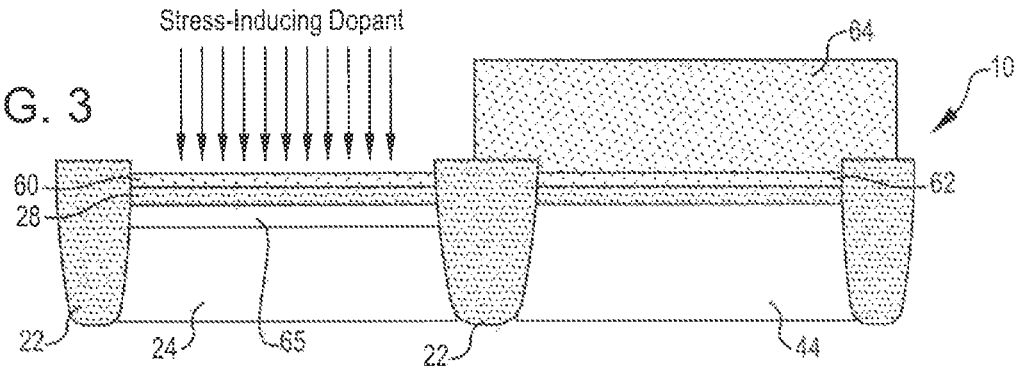

Referring to FIG. 3, in a subsequent step, a mask 64 is formed over the region 62, and a stress-inducing dopant, such as C, is implanted into the substrate 24 to form intermediate region 65. The energy of the implant is high enough so that little or no C is implanted into the region 60 or the buried oxide 28, but is low enough so that the intermediate region is contiguous with the buried oxide such that the still-to-be-formed stress-inducing region 26 (FIG. 1) will be as close as possible to the region 60, in which the body 18 (FIG. 1) will subsequently be formed. Alternatively, the intermediate region 65 may be formed such that it there is a portion of the substrate 24 between the intermediate region and the buried oxide 28 having little or no stress-inducing dopant.

Before or after the implant of the stress-inducing dopant, other dopants may be implanted into the substrate 24, buried oxide 28, or region 60 using the mask 64. For example, as described above in conjunction with FIG. 1, one may implant a ground-plane dopant such as In or As into the substrate 24 using the mask 64.

By implanting the stress-inducing dopant into the substrate 24 using the same mask 64 that is used for other implants, one can perform the stress-inducing-dopant implant without increasing the number of masks, and thus without increasing the number of lithography steps, as compared to a fabrication process for a transistor with no stress-inducing region 26 (FIG. 1).

After the completion of the one or more implants using the mask 64, the mask is removed in a conventional manner.

Figure 4:
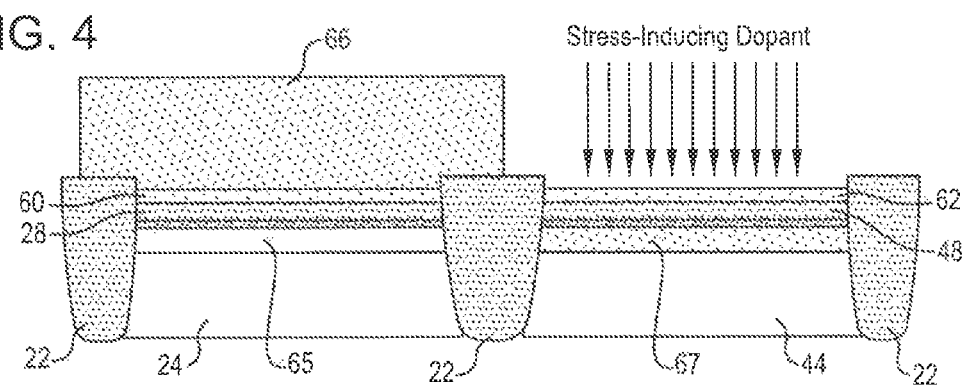

Referring to FIG. 4, in a subsequent step, a mask 66 is formed over the region 60, and a stress-inducing dopant, such as Ge, is implanted into the substrate 44 to form an intermediate region 67. The energy of the implant is high enough so that little or no Ge is implanted into the region 62 or the buried oxide 48, but is low enough so that the intermediate region 67 is contiguous with the buried oxide such that the still-to-be-formed stress-inducing region 46 (FIG. 1) will be as close as possible to the region 62, in which the body 20 (FIG. 1) will subsequently be formed. Alternatively, the intermediate region 67 may be formed such that there is a portion of the substrate 44 between the intermediate region and the buried oxide 48 having little or no stress-inducing dopant.

Before or after the implant of the stress-inducing dopant, other dopants may be implanted into the substrate 44, buried oxide 48, or region 62 using the mask 66. For example, as described above in conjunction with FIG. 1, one may implant a ground-plane dopant into the substrate 44 using the mask 66.

By implanting the stress-inducing dopant into the substrate 44 using the same mask 66 that is used for other implants, one can perform the stress-inducing-dopant implant without increasing the number of masks, and thus without increasing the number of lithography steps, as compared to a fabrication process for a transistor with no stress-inducing region 46 (FIG. 1).

After the completion of the one or more implants using the mask 66, the mask is removed in a conventional manner, and the die on which the integrated circuit 12 is disposed, in its current state of fabrication, is subjected to a rapid thermal anneal (RTA) to re-crystallize the substrates 24 and 44 (where the substrates 24 and 44 are single-crystalline (i.e., monocrystalline) silicon, the stress-inducing implants, ground-plane implants, or other implants can damage the crystal-lattice structure, and the RTA effectively repairs some or all of this damage). Alternatively, the integrated circuit 12 may be subjected to respective RTAs after the one or more implants using the mask 64 (FIG. 3), and then after the one or more implants using the mask 66. Furthermore, because the one or more RTAs would be performed even if no stress-inducing dopants were implanted, these one or more RTAs add no further steps to the fabrication process as compared to a fabrication process for transistors with no stress-inducing regions 26 and 46 (FIG. 1).

Figure 5:
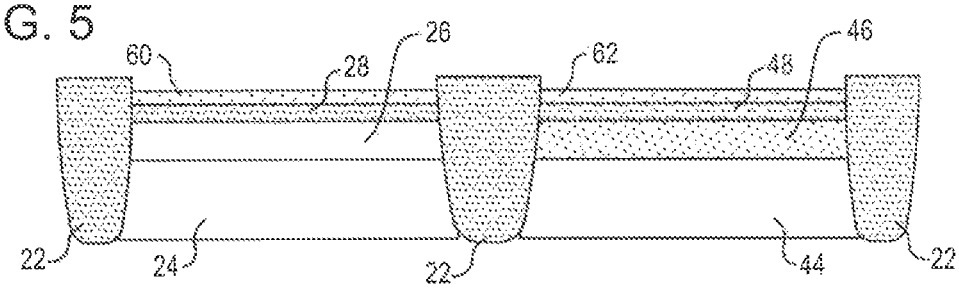

Referring to FIG. 5, in a subsequent step, the die on which the integrated circuit 12 is disposed, in its current state of fabrication, is subjected to a high-temperature anneal (HTA) to fully form the stress-inducing regions 26 and 46 from the intermediate regions 65 and 67 (FIGS. 3 and 4), respectively. For example, the HTA may cause the stress-inducing dopants to diffuse and expand the volume of the intermediate regions 65 and 67 so as to form the stress-inducing regions 26 and 46, and may cause these stress-inducting regions to be contiguous with the buried oxides 28 and 48 such that the stress-inducting regions are as close as possible to the still-to-be-formed body regions 18 and 20 (FIG. 1). Alternatively, the one or more RTAs discussed above in conjunction with FIGS. 3 and 4 may be omitted, and only the HTA may be performed to recrystallize the substrates 24 and 44 and form the stress-inducing regions 26 and 46. Furthermore, regardless of whether the HTA is performed in addition to or instead of the one or more RTAs, it may not add an additional step to the fabrication process as compared to the fabrication process of transistors without substrate stress-inducing regions because the HTA may be used to form other regions as well.

Figure 6:
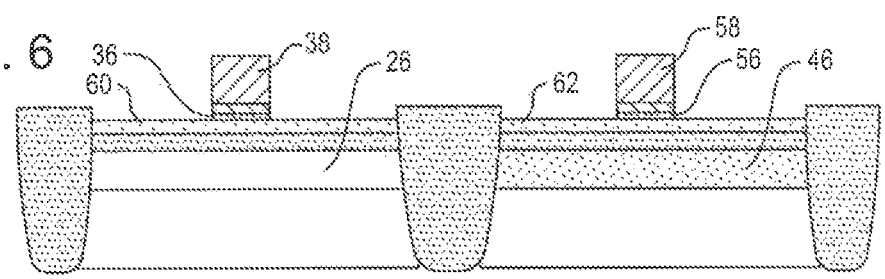

Referring to FIG. 6, in a subsequent step, body-dopant implants (not shown in FIG. 6) are performed into the regions 60 and 62 if these implants have not already been performed.

Next, the gate insulators 36 and 56 are formed over the regions 60 and 62 in a conventional manner, and the gates 38 and 58 are formed over the gate insulators in a conventional manner such that the body 18 is formed in the portion of the region 60 beneath the gate 38 and the body 20 is formed in the portion of the region 62 beneath the gate 58. Each gate 38 and 58 may be formed as a single-layer or multi-layer structure.

Dopant implants, such as lightly-doped-drain (LDD) implants, then may be made into the exposed portions of the regions 60 and 62 using the gates 38 and 58 as masks. As described below, the exposed portions of the regions 60 and 62 will become lower portions of the source/drain regions 32 and 34 and 52 and 54, respectively.

Figure 7:
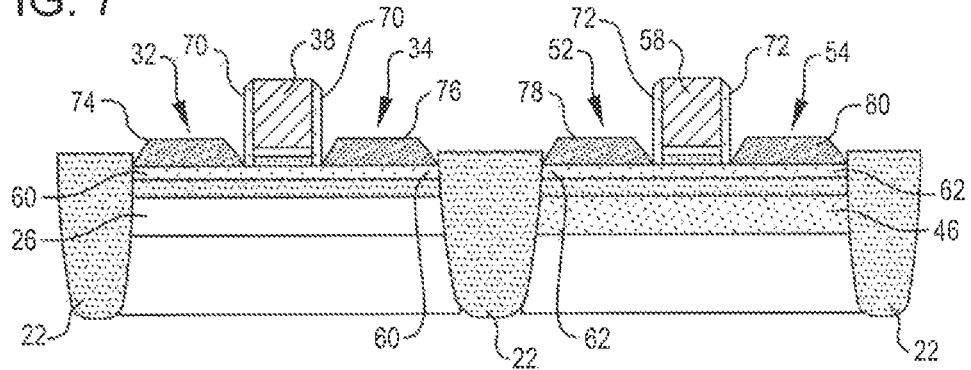

Referring to FIG. 7, in a subsequent step, intermediate spacers 70 and 72 are formed, for example, from silicon nitride (SiN), on the sidewalls of the gates 38 and 58 in a conventional manner.

Next, raised source/drain portions 74 and 76, and 78 and 80, are formed, (e.g., epitaxially grown) on the exposed portions of the regions 60 and 62 in a conventional manner to form the source/drain regions 32 and 34, and 52 and 54, respectively.

Figure 8:
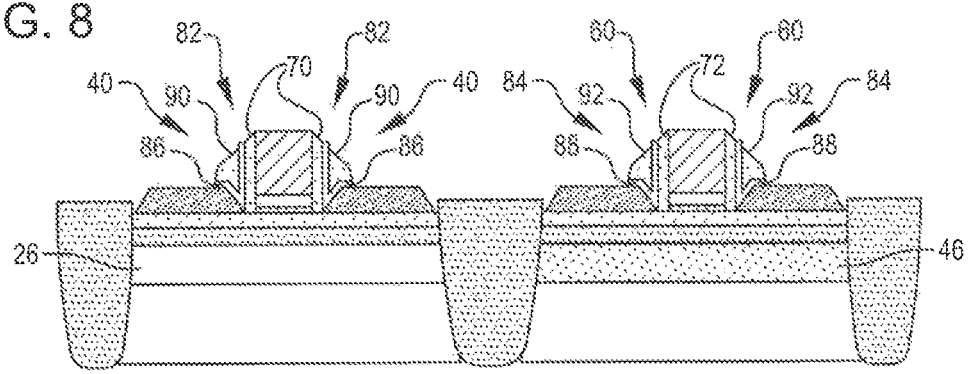

Referring to FIG. 8, in a subsequent step, source/drain spacers 82 and 84 are formed over the intermediate spacers 70 and 72 to form the sidewall spacers 40 and 60, respectively. The source/drain spacers 82 and 84 may be formed by forming respective first regions 86 and 88 of silicon dioxide ($SiO_2$) over the intermediate spacers 70 and 72, and then by forming respective second regions 90 and 92 of SiN over the first regions.

Referring to FIG. 9, in a subsequent step, a mask 96 is formed over the gate 58 and source/drain regions 52 and 54, and a tensile-stress-inducing dopant, such as C, is implanted into the source/drain regions 32 and 34; this implant may be called a stress "seeding" implant. The gate 38 and sidewall spacer 40 act to mask the body 18 from this implant (a mask, not shown, may be formed over the gate 38 to shield it from implanted dopants). As discussed above in conjunction with FIG. 1, one may implant a lower concentration of stress-inducting dopant into the source/drain regions 32 and 34 as compared to the concentration of stress-inducing dopant in the region 26 for a number of reasons, including: 1) reducing or eliminating the amount of stress-inducing dopant that may diffuse into the body 18, and 2) because the source/drain regions 32 and 34 are contiguous with the body 18, a given magnitude of tensile stress may be induced in the body by a smaller concentration of stress-inducing dopant in the source/drain regions as compared to the concentration of dopant needed in the region 26 to induce the same magnitude of tensile stress in the body.

Before or after the implant of the stress-inducing dopant, other dopants, such as a conventional source/drain activation dopant (e.g., As) that makes the source drain/regions 32 and 34 N-type, may be implanted into the source/drain regions using the mask 96.

By implanting the stress-inducing dopant into the source/drain regions 32 and 34 using the same mask 96 that is used for one or more other implants, one can perform the stress-inducing-dopant implant without increasing the number of masks, and thus without increasing the number of lithography steps, as compared to a fabrication process for a transistor with no stress-inducing dopant in the source/drain regions.

After the completion of the one or more implants using the mask 96, the mask is removed in a conventional manner.

Referring to FIG. 10, in a subsequent step, a mask 100 is formed over the gate 38 and source/drain regions 32 and 34, and a compressive-stress-inducing dopant, such as Ge, is implanted into the source/drain regions 52 and 54; this implant may be called a stress "seeding" implant. The gate 58 and sidewall spacer 60 act to mask the body 20 from this implant (a mask, not shown, may be formed over the gate 58 to shield it from implanted dopants). As described above in conjunction with FIG. 1, one may implant a lower concentration of stress-inducting dopant into the source/drain regions 52 and 54 as compared to the concentration of stress-inducing dopant in the region 46 for a number of reasons, including: 1) reducing or eliminating the amount of stress-inducing dopant that may diffuse into the body 20, and 2) because the source/drain regions 52 and 54 are contiguous with the body 20, a given magnitude of compressive stress may be induced in the body by a smaller concentration of stress-inducing dopant in the source/drain regions as compared to the concentration of dopant needed in the region 46 to induce the same magnitude of compressive stress in the body.

Before or after the implant of the stress-inducing dopant, other dopants, such as a conventional source/drain activation dopant (e.g., P) that makes the source drain/regions 52 and 54 P-type, may be implanted into the source/drain regions using the mask 100.

By implanting the stress-inducing dopant into the source/drain regions 52 and 54 using the same mask 100 that is used for one or more other implants, one can perform the stress-inducing-dopant implant without increasing the number of masks, and thus without increasing the number of lithography steps, as compared to a fabrication process for a transistor with no stress-inducing dopant in the source/drain regions.

After the completion of the one or more implants using the mask 100, the mask is removed in a conventional manner.

Referring to FIG. 11, in a subsequent step, after the completion of the one or more implants using the masks 96 and 100 (FIGS. 9-10), the integrated circuit 12, in its current state of fabrication, is subjected to a HTA to activate the stress-inducing and other dopants in the source/drain regions 32 and 34, and 52 and 54, and thus to cause the source/drain regions 32 and 34 to impart a tensile stress to the body 18, and to cause the source/drain regions 52 and 54 to impart a compressive stress to the body 20. Alternatively, the integrated circuit 12 may be subjected to respective HTAs after the one or more implants using the mask 96, and then after the one or more implants using the mask 100. Furthermore, because the one or more HTAs would be performed to activate one or more other source/drain dopants even if no stress-inducing dopants were implanted, these one or more HTAs add no further steps to the fabrication process as compared to a fabrication process for transistors with no stress-inducing source/drain regions.

Referring again to FIG. 1, additional conventional fabrication steps may be performed to complete the fabrication of the integrated circuit 12.

In an alternative embodiment for fabricating the NFET 14 and PFET 16 of FIG. 1, where the stress-inducing regions 26 and 46 and the source/drain regions 32 and 34, and 52 and 54, are formed (e.g., grown or deposited) already including the stress-inducing dopants (e.g., SiGe or SiC), then the stress-inducing-dopant-implant steps may be omitted, thus further reducing the number of fabrication steps.

FIG. 12 is a cross-sectional view of a portion 110 of an embodiment of an integrated circuit 112, the portion including an NFET 114 and a PFET 116 with stressed bodies 118 and 120, respectively; in an embodiment, the NFET and PFET are extreme-thin-silicon-on-insulator (ETSOI) transistors.

The NFET 114 and the PFET 116 are similar to the NFET 14 and NFET 16 of the integrated circuit 12 except that the buried oxides 28 and 48 of the integrated circuit 12 are thinner than the buried oxides 122 and 124 of the integrated circuit 112, which may have a thickness in an approximate range of 50-140 nm.

Furthermore, the NFET 114 and PFET 116 may omit stress-inducing regions in their substrates 126 and 128 because the stress induced by these regions on the bodies 118 and 120 may be significantly attenuated, and thus rendered negligible, by the relatively thick buried oxides 122 and 124.

In an embodiment, the integrated circuit 112 may be formed in a manner similar to the manner in which the integrated circuit 12 is formed as described above in conjunction with FIGS. 2-11. But if the NFET 114 and PFET 116 lack stress-inducing regions in their substrates 126 and 128, then the stress-inducing-dopant implant steps of FIGS. 3 and 4 may be omitted.

FIG. 13 is a block diagram of an embodiment of a system 150, which may include one or more of the integrated circuits 12 and 112 of FIGS. 1 and 12 according to an embodiment. For purposes of illustration, the system 150 is hereinafter described as including one integrated circuit 12, it being understood that the system may include multiple integrated circuits 12, a single or multiple integrated circuits 112, or a combination of any number of the integrated circuits 12 and 112.

Examples of the system 150 include a computer system, a smart phone, a computer pad or tablet, and a portable music device.

In addition to the integrated circuit 120, the system 150 includes an input device 152, such as a key pad, an output device 154, such as a display screen, a storage device 156, such as a disk drive, and a controller 158, such as a microprocessor or microcontroller, coupled to the integrated circuit 12 (whether or not the integrated circuit is a controller), input device, output device, and storage device.

Still referring to FIG. 13, alternate embodiments of the system 150 are contemplated. For example, although shown as being disposed on different dies, the controller 158 and integrated circuit 12 may be disposed on a same die, or the controller may be another type of integrated circuit.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the disclosure.

What is claimed is:

1. A transistor, comprising:
   a silicon-on-insulator (SOI) substrate including a substrate layer, an insulator layer and a semiconductor layer;
   a trench isolation structure formed in said SOI substrate to extend completely through the semiconductor layer and the insulator layer and at least partially into the substrate layer;
   a source, body and drain of said transistor formed in the semiconductor layer; and
   a doped region formed in the substrate layer and extending under the insulator layer from one edge of the trench isolation structure to an opposite edge of the trench isolation structure and extending contiguously under the source, body and drain, said doped region including a stress-inducing dopant that induces stress within the doped region of the substrate layer under the insulator layer that is transferred through the insulator layer to a channel region of the body.

2. The transistor of claim 1, wherein the doped region is configured to stress the body by imparting a tensile stress to the body.

3. The transistor of claim 1, wherein the doped region is configured to stress the body by imparting a compressive stress to the body.

4. The transistor of claim 1, wherein the doped region is doped with a carbon dopant material.

5. The transistor of claim 1, wherein the doped region is doped with a germanium dopant material.

6. The transistor of claim 1, wherein the insulating layer has a thickness of between 10-25 nm.

7. The transistor of claim 1, wherein at least one of the source and the drain formed in the semiconductor layer is doped to stress at least a portion of the body.

8. The transistor of claim 1, wherein the at least one of the source and the drain is doped with a carbon dopant material.

9. The transistor of claim 1, wherein the at least one of the source and the drain is doped with a germanium dopant material.

10. The transistor of claim 1, wherein the doped region formed in the substrate layer is an implanted region.

11. The transistor of claim 1, wherein the doped region formed in the substrate layer is one of a grown or deposited region.

12. A method, comprising:
forming a trench isolation structure in a silicon-on-insulator (SOI) substrate including a substrate layer, an insulator layer and a semiconductor layer, wherein said trench isolation structure extends completely through the semiconductor layer and the insulator layer and at least partially into the substrate layer;
forming a doped region in the substrate layer which extends under the insulator layer from one edge of the trench isolation structure to an opposite edge of the trench isolation structure; and
forming a source, body and drain of a transistor in the semiconductor layer;
wherein the doped region extends contiguously under the source, body and drain; and
wherein said doped region includes a stress-inducing dopant that induces stress within the doped region of the substrate layer under the insulator layer that is transferred through the insulator layer to a channel region of the body.

13. The method of claim 12, wherein the doped region is configured to stress the body by imparting a tensile stress to the body.

14. The method of claim 12, wherein the doped region is configured to stress the body by imparting a compressive stress to the the body.

15. The method of claim 12, wherein forming the source, body and drain further comprises doping at least one of the source and the drain formed in the semiconductor layer to stress at least a portion of the body.

16. The method of claim 12, wherein forming the doped region comprises implanting dopant through the semiconductor layer and the insulator layer into the substrate layer.

17. The method of claim 16, wherein implanting dopant comprises using a mask to implant the dopant for the doped region and using the same mask to implant a dopant for a ground-plane region formed in the substrate layer.

18. The method of claim 12, wherein forming the doped region comprises growing or depositing the doped region on the substrate layer.

19. A transistor, comprising:
a body including a channel region;
a source region and a drain region on either side of the body;
an insulating layer supporting the body, source region and drain region;
a substrate layer supporting the insulating layer and including a doped semiconductor region disposed to extend contiguously directly underneath the insulating layer, source region, body and drain region, said doped semiconductor region including a stress-inducing dopant that induces stress within the doped region of the substrate layer under the insulating layer that is transferred through the insulator layer to a channel region of the body.

20. The transistor of claim 19, wherein at least one of the source region and the drain region is doped and configured to apply further stress to at least a portion of the body.

21. The transistor of claim 19, further comprising a trench isolation structure formed in said substrate layer, wherein said doped semiconductor region extends from one edge of the trench isolation structure to an opposite edge of the trench isolation structure underneath the insulating layer, source region, body and drain region.

* * * * *